(12) United States Patent
Ju

(10) Patent No.: US 6,376,286 B1
(45) Date of Patent: *Apr. 23, 2002

(54) FIELD EFFECT TRANSISTOR WITH NON-FLOATING BODY AND METHOD FOR FORMING SAME ON A BULK SILICON WAFER

(75) Inventor: Dong-Hyuk Ju, Cupertino, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,305

(22) Filed: Oct. 20, 1999

(51) Int. Cl.$^7$ .............................................. H01L 29/76
(52) U.S. Cl. ..................... 438/149; 438/243; 438/411; 438/421; 438/422
(58) Field of Search ................................ 438/294, 411, 438/421, 422, 243, 248, 386, 391, 301, 303, 433, 424, 526; 257/66, 67, 347, 349, 302, 401, 329

(56) References Cited

U.S. PATENT DOCUMENTS

| | | |
|---|---|---|
| 4,571,609 A | 2/1986 | Hatano |
| 4,682,407 A | 7/1987 | Wilson et al. ................ 29/576 |
| 4,683,637 A | 8/1987 | Varker et al. |
| 4,888,300 A | 12/1989 | Burton ........................ 437/61 |
| 5,097,312 A * | 3/1992 | Bayraktaroglu .............. 357/43 |
| 5,262,346 A | 11/1993 | Bindal et al. |
| 5,324,671 A * | 6/1994 | Bayraktaroglu .............. 437/31 |
| 5,391,503 A | 2/1995 | Miwa et al. .................. 437/31 |
| 5,401,998 A * | 3/1995 | Chiu et al. .................. 257/368 |
| 5,466,630 A | 11/1995 | Lur ............................ 437/62 |
| 5,489,792 A | 2/1996 | Hu et al. |
| 5,494,837 A | 2/1996 | Subramanian et al. |
| 5,543,338 A | 8/1996 | Shimoji |
| 5,618,345 A | 4/1997 | Saitoh et al. |
| 5,620,912 A * | 4/1997 | Hwang et al. ............... 438/301 |
| 5,674,760 A | 10/1997 | Hong |
| 5,683,932 A * | 11/1997 | Bashir et al. ................ 437/67 |
| 5,702,989 A * | 12/1997 | Wang et al. ................. 438/397 |
| 5,801,397 A * | 9/1998 | Cunningham ................ 257/66 |
| 5,804,856 A | 9/1998 | Ju |
| 5,811,855 A | 9/1998 | Tyson et al. |
| 5,825,696 A | 10/1998 | Hidaka et al. |
| 5,846,857 A | 12/1998 | Ju |
| 5,877,046 A | 3/1999 | Yu et al. |

(List continued on next page.)

FOREIGN PATENT DOCUMENTS

EP        0 480 373 A2      10/1991

OTHER PUBLICATIONS

S. Wolf and R.N. Tauber, Silicon Processing for the VLSI Era, vol. 1, p. 531.

*Primary Examiner*—Charles Bowers
*Assistant Examiner*—Laura Schillinger
(74) *Attorney, Agent, or Firm*—Renner, Otto, Boisselle & Sklar, LLP

(57) ABSTRACT

A silicon on insulator (SOI) field effect transistor (FET) structure is formed on a conventional bulk silicon wafer. The structure includes an electrical coupling between the channel region of the FET with the bulk silicon substrate to eliminate the floating body effect caused by charge accumulation in the channel regions due to historical operation of the FET. The method of forming the structure includes isolating the FET active region from other structures in the silicon substrate by forming an insulating trench about the perimeter of the FET and forming an undercut beneath the active region to reduce or eliminate junction capacitance between the source and drain regions and the silicon substrate.

23 Claims, 3 Drawing Sheets

U.S. PATENT DOCUMENTS

| | | | |
|---|---|---|---|
| 5,879,975 A | | 3/1999 | Karlsson et al. |
| 5,894,152 A | * | 4/1999 | Jaso et al. .................. 257/347 |
| 5,907,768 A | * | 5/1999 | Malta et al. ................ 438/105 |
| 5,963,789 A | | 10/1999 | Tsuchiaki |
| 5,972,758 A | * | 10/1999 | Liang ........................ 438/294 |
| 5,976,945 A | * | 11/1999 | Chi et al. ................... 438/386 |
| 5,977,579 A | * | 11/1999 | Noble ........................ 257/302 |
| 6,004,864 A | * | 12/1999 | Huang et al. ............... 438/433 |
| 6,008,104 A | * | 12/1999 | Schrems .................... 438/386 |
| 6,066,527 A | * | 5/2000 | Kudelka et al. ............ 438/243 |

* cited by examiner

FIELD EFFECT TRANSISTOR WITH NON-FLOATING BODY AND METHOD FOR FORMING SAME ON A BULK SILICON WAFER

TECHNICAL FIELD

The present invention relates generally to silicon on insulator (SOI) field effect transistor structures, and more specifically to such structures formed on a conventional silicon bulk wafer.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance problem, silicon on insulator technology (SOI) has been gaining popularity. However, SOI field effect transistors suffer from floating body effects. The floating body effect occurs because the channel, or body, of the transistor is not connected to a fixed potential and, therefore the body takes on charge based on recent operation of the transistor. The floating body effect causes the current-to-voltage curve for the transistor to distort or kink, which in turn causes the threshold voltage for operating the transistor to fluctuate. This problem is particular apparent for passgate devices such as those used in dynamic random access memory (DRAM) wherein it is critical that the threshold voltage remain fixed such that the transistor remains in the "off" position to prevent charge leakage from the storage capacitor.

Accordingly, there is a strong need in the art for a semiconductor field effect transistor structure, and a method for forming such structure, that includes the low junction capacitance and low "off" state leakage characteristics of the SOI FET but does not suffer the disadvantages of a floating body potential.

SUMMARY OF THE INVENTION

A first object of this invention is to provide a method of forming a field effect transistor on a semiconductor substrate which includes etching an insulating trench around the perimeter of an active region of said transistor to isolate the active region from other structures on said substrate and etching an insulating undercut in the bottom of the insulating trench to isolate at least a portion of the bottom surface of the active region from the substrate. Portions of the active region may be doped to form each of a source region and a drain region on opposing sides of a central channel region. The insulating undercut may isolate at least a portion of both the source region and the drain region from the silicon substrate. Furthermore, the insulating undercut may isolate at least a portion of the central channel region from the silicon substrate.

Etching the undercut includes: a) forming a protective layer on the side walls and bottom of the trench; b) performing a vertical anisotropic etch of said layer to remove such layer to expose silicon substrate at the bottom of the trench; and c) performing an isotropic etch of the silicon substrate to form said undercut. The isotropic etch may be performed using a KOH wet etch. The protective layer may be silicon dioxide and filling the undercut may include performing a chemical vapor deposition using at least one of SiH4 and TEOS.

A second object of this invention is to provide a field effect transistor formed on a semiconductor substrate which includes an active region, including a central channel region and a source region and a drain region disposed on opposite sides of said central channel region, a bridge region, with a cross section area smaller than a cross section of the active region, consecutively coupling the central channel region with said semiconductor substrate; and an insulator isolating said active region and said bridge region from other structures formed on said semiconductor substrate. The central channel region, the bridge region, and the semiconductor substrate may all be the same conductivity and the source region and drain region may be of an opposite conductivity. The insulator may extend under a bottom surface of the active region to at least partially isolate the source region and the drain region from the silicon substrate such that the semiconductor junctions between the source region and the silicon substrate and the drain region and the silicon substrate are at least one of reduced in size or eliminated. The insulator may be silicon dioxide.

A third object of this invention is to provide a semiconductor device including a plurality of field effect transistors formed on a semiconductor substrate, each transistor including: a) an active region, including a central channel region and a source region and a drain region each on opposing sides of the central channel region; b) a bridge region, with a cross section area smaller than a cross section of the active body region, conductively coupling the central channel region with said semiconductor substrate; and c) an insulator isolating said active body region and said bridge region from at least one other of said plurality of transistors. The central channel region, the bridge region, and the semiconductor substrate all may be the same conductivity and the source region and drain region may be of an opposite conductivity. The insulator may extend under a bottom surface of the active region to at least partially isolate the source region and the drain region from the silicon substrate such that the semiconductor junctions between the source region and the silicon substrate and the drain region and the silicon substrate are at least one of reduced in size or eliminated. The insulator isolating at least two of the plurality of transistors may be silicon dioxide.

DESCRIPTION OF THE PREFERRED EMBODIMENTS

Figure 1:
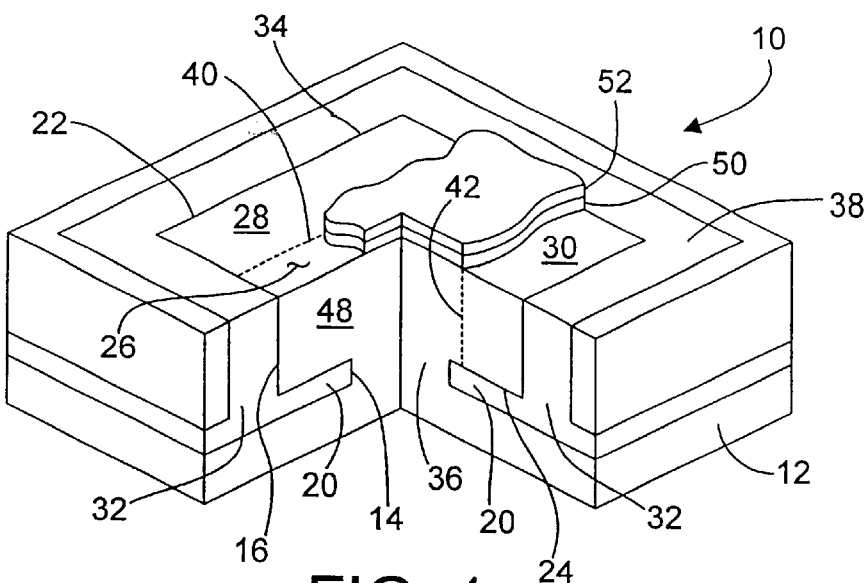
FIG. 1 is a perspective view, partially cut away, of a field effect transistor (FET) formed on silicon substrate in accordance with this invention.

The present invention will now be described in detail with reference to the drawings. In the drawings, like reference numerals are used to refer to like elements throughout.

Referring to FIG. 1, it can be seen that an active region 48 of a field effect transistor 10 of this invention includes a channel region 26, a source region 28, and a drain region 30. In the exemplary embodiment of this invention, the channel region 26 is preferably P-conductivity silicon while the source region 28 and the drain region 30 are each N-conductivity silicon to form two semiconductor junctions 40 and 42. However, in accordance with known silicon technology, the channel region 26 may be N-conductivity silicon while each of the source region 28 and the drain region 30 are P-conductivity silicon. The active region is isolated by an insulating trench 32 which has side walls 16 forming the perimeter 22 of the active region 48 of the FET 10. The insulating trench 32 insulates the active region 48 from other structures formed in the silicon substrate 12. The insulating trench 32 includes under cut regions 20 which form the bottom surface 24 of the active region 48 and form the sidewalls 14 of a bridge region 36 which electrically couples the channel region 26 of the active region 48 to the bulk silicon substrate 12. The active region 38 and the bridge region 36 together form the body 34 of the FET 10 of this invention.

It should be appreciated that because the bridge region 36 electrically couples the channel region 26 to the bulk silicon substrate 12, the channel region 26 potential will always remain at the potential of the silicon substrate 12 and can not accumulate a charge, or float, based on historical operation of the FET 10. It should also be appreciated that because the insulating trench 32 includes undercut regions 20, the cross sectional area of the bridge region 36 is significantly smaller than the cross sectional area of the active region 48 and therefore there is no semiconductor junction, or minimal sized semiconductor junction, between either the source region 28 or the drain region 30 and the silicon substrate 12 thereby reducing junction capacitance.

Figure 2:
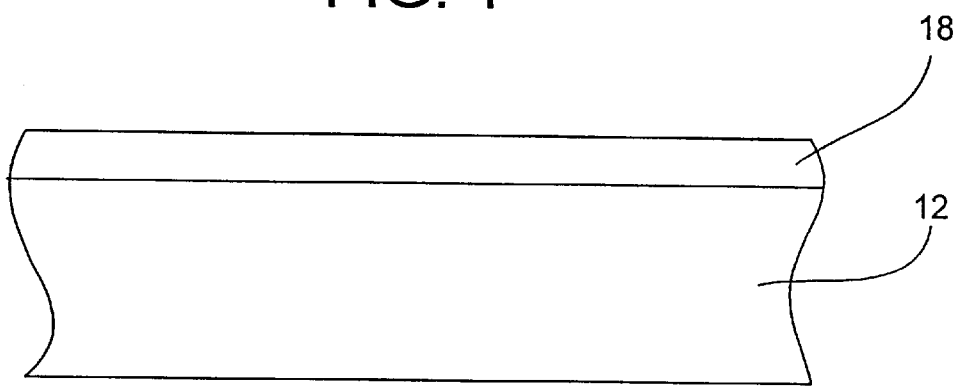
FIG. 2 is a cross sectional view of a first step in the fabrication of the FET of this invention.

The first step in fabricating the FET of this invention a silicon nitride layer 18 approximately 1,500–2,000 Angstroms thick is formed on top of a thin layer of oxide (not shown) approximately 150–200 Angstroms thick on the top surface of the bulk silicon substrate 12 as shown in FIG. 2.

Figure 3:
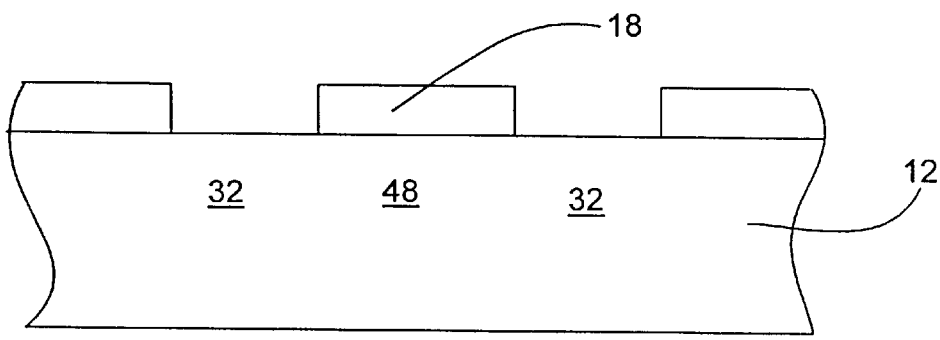
FIG. 3 is a cross sectional view of a second step in the fabrication of the FET of this invention.

In a second step, the silicon nitride 18 is patterned and etched to form a silicon nitride mask over the active region 48 while exposing the silicon substrate in the areas where insulating trench 32 is to be formed as shown in FIG. 3. Patterning and etching the silicon nitride 18 to form the silicon nitride mask is performed using conventional photolithography techniques wherein 1) a layer of a UV sensitive photoresist layer is applied to the surface of the silicon nitride 18; 2) a UV illumination source and reticle provide collimated light to expose and pattern the photoresist; 3) A developer solution hardens the unexposed areas of the photoresist while the UV light dissolves and the developer washes away the exposed portions thereby leaving the exposed portions as a mask on the surface of the silicon nitride 18; and 4) a dry etch with an etching compound that etches silicon nitride while not etching the photoresist removes the silicon nitride layer 18 in the areas that are not masked with the photoresist thereby creating the silicon nitride mask.

Figure 4:
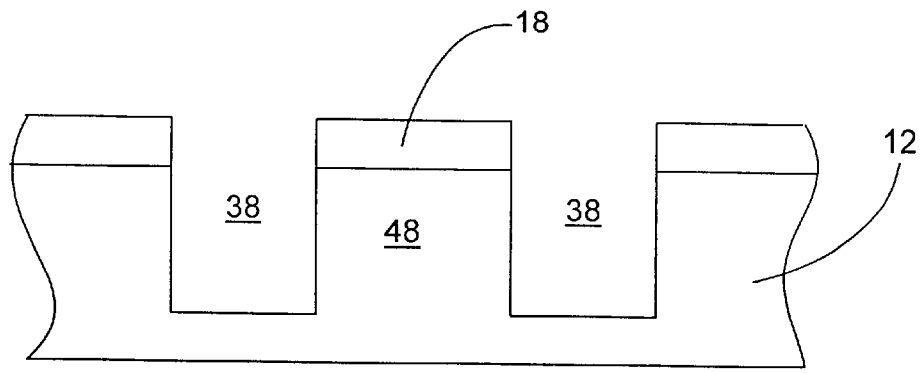
FIG. 4 is a cross sectional view of a third step in the fabrication of the FET of this invention.

In a third step in the fabrication of the FET of this invention the unmasked portions of the silicon substrate 12 (e.g. the portions where the silicon nitride mask has been etched away in the second step) are etched away to a depth of approximately 2,000–4,000 Angstroms to form an open trench 38 as shown in FIG. 4. The open trench 38 will later be filled with silicon dioxide to become the insulating trench 32 described in the discussion of FIG. 1. The etching process for the silicon substrate is typically an anisotropic dry etch using hydrogen bromide (HBr) which has selectivity characteristics such that it etches the silicon substrate 12 but not the silicon nitride 18.

Figure 5:
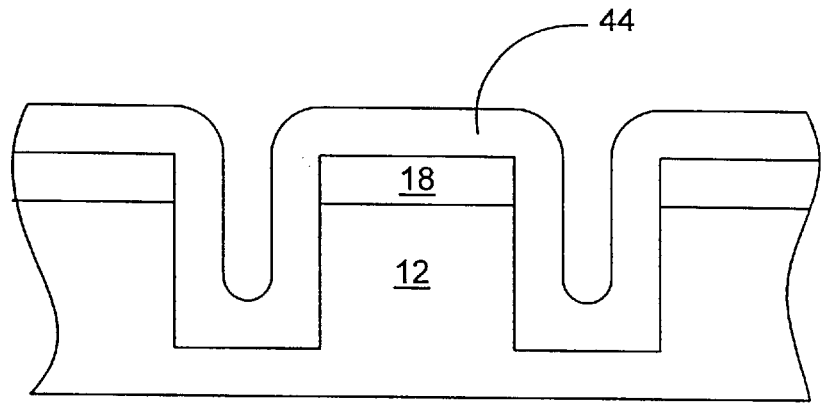
FIG. 5 is a cross sectional view of a fourth step in the fabrication of the FET of this invention.
Figure 6:
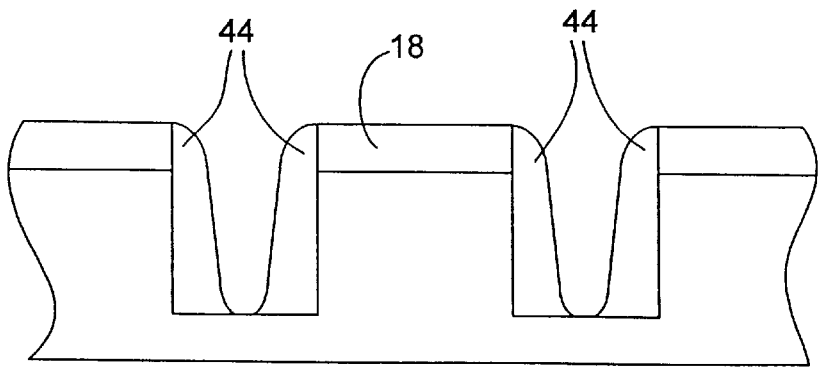
FIG. 6 is a cross sectional view of a fifth step in the fabrication of the FET of this invention.

A fourth step in the fabrication of the FET 10 of this invention includes depositing a layer of silicon dioxide 44, approximately 500–1,000 Angstroms in depth, across all exposed surfaces of the wafer including the across the top of the silicon nitride layer 18 and on the sidewalls and bottom of open trench 38 as shown in FIG. 5. Depositing the layer of silicon dioxide 44 is typically performed using a conventional chemical vapor deposition (CVD) process with a gas such as SiH4.

Following the deposit of the silicon dioxide 44, a vertical anisotropic etch of the silicon dioxide layer 44 removes such silicon dioxide from all horizontal surfaces, including the top surface of the silicon nitride 18 and the bottom of open trench 38. An example of a vertical anisotropic etch includes a plasma etch using CHF3. It should be appreciated that such an etching technique removes an even thickness of the silicon dioxide layer in a vertical dimension such that the net result of the vertical etch is that a layer of silicon dioxide remains on the side walls 16 of the open trench 38 while the bottom of trench 38 is exposed silicon substrate 12.

Figure 7:
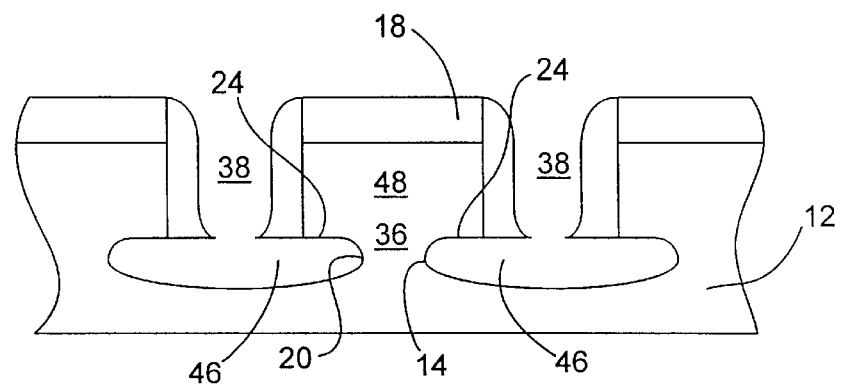
FIG. 7 is a cross sectional view of a sixth step in the fabrication of the FET of this invention.

In the sixth step in the fabrication of the FET 10 of this invention an isotropic etch of the bulk silicon at the bottom of the open trench 38 is performed to remove approximately 1,000–2,000 Angstroms of material in both the horizontal and vertical dimensions to form an open undercut 46 which in a subsequent step will be filled with silicon dioxide to form the undercut region 20 of the insulating trench 32 as shown in FIG. 7. This isotropic etching step is preferably a known KOH wet etch. It should be appreciated that such an etching compound must be chosen with selectivity characteristics such that it will rapidly etch the exposed silicon substrate 12 but will not materially etch the silicon dioxide coating 44 on the sidewalls of the open trench 38. Note that undercut regions 20 define the bottom surface 24 of the active region 48 and the side walls 14 of the bridge region 36.

Figure 8:
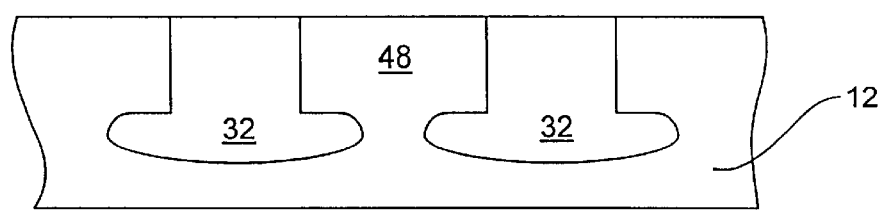
FIG. 8 is a cross sectional view of a seventh step in the fabrication of the FET of this invention.

Following the creation of the undercut regions 20, the open trench 38 is filled with silicon dioxide to form insulating trench 32. Filling the open trench 38 preferably uses a known CVD process using a gas such as SiH4 or TEOS. After filling the open trench 38, the surface of the wafer is polished using a chemical mechanical polish (CMP) to remove any excess silicon dioxide layer and the remaining silicon nitride mask as shown in FIG. 8.

Figure 9:
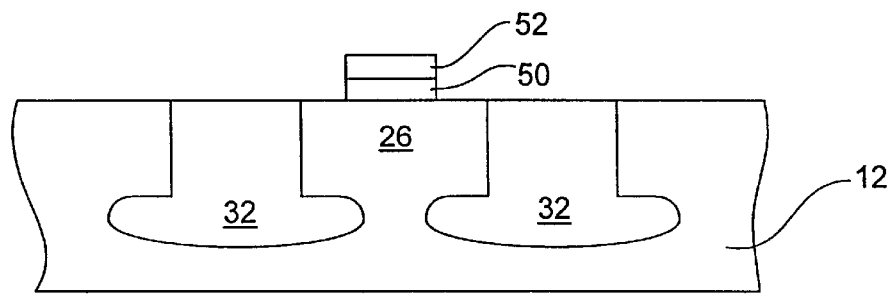
FIG. 9 is a cross sectional view of a eighth step in the fabrication of the FET of this invention.

In a seventh step, a layer of silicon dioxide 50, serving as the gate oxide layer, and a polysilicon gate 52 are formed on the top surface of the substrate. The silicon dioxide 50 is typically grown on the surface of the active region 48 using a thermal oxidation process and the polysilicon layer is deposited on top of the silicon dioxide layer 50 using a low pressure chemical vapor deposition (LPCVD) process. The polysilicon layer is then patterned and etched using the photolithography method discussed earlier to define and mask the channel region of the FET 10 in a known self aligning gate, source and drain process as shown in FIG. 9.

Figure 10:
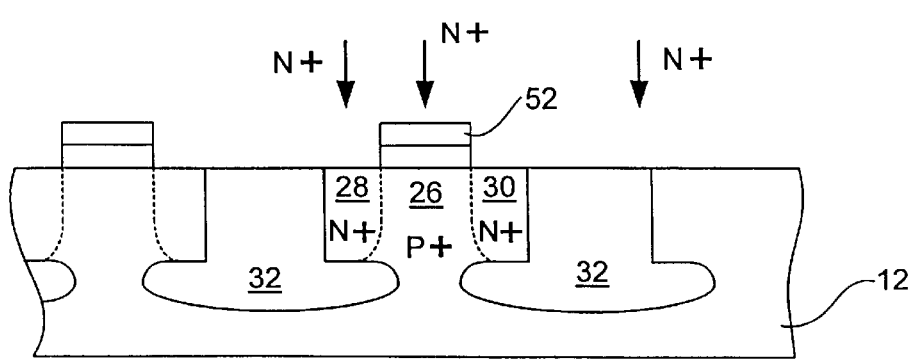
FIG. 10 is a cross sectional view of the FET of this invention.

In the eighth step, the portions of the silicon substrate on opposing sides of the P-type silicon in the channel region of the FET 10 that are not masked by the gate applied in the 7$^{th}$ step are doped into N-type silicon. Doping is typically performed using ion implantation techniques. Ions of dopant such as arsenic 54 are accelerated to a high velocity in an electric field and impinge on the target wafer. Because the ions cannot penetrate the poly-silicon gate, the poly-silicon gate effectively operates as a mask which results in doping only the exposed source region 28, the drain region 30, and the polysilicon gate 52 as shown in FIG. 10.

Although the invention has been shown and described with respect to certain preferred embodiments, it is obvious that equivalents and modifications will occur to others skilled in the art upon the reading and understanding of the specification. For example, in the exemplary embodiment, two masking steps are used to mask and etch the open trench regions 38. A photoresist mask is used to create a silicon nitride mask which in turn effects the etching of the open trenches 38. Those skilled in the art will appreciate that if a compound is selective between the photoresist and the silicon substrate (e.g. etches the silicon substrate while not materially effecting a photoresist mask.) the photoresist mask may be used to directly etch the open trenches in the silicon substrate. The present invention includes all such equivalents and modifications, and is limited only by the scope of the following claims.

What is claimed is:

1. A method of forming a field effect transistor on a semiconductor substrate, comprising of:
   a) etching an insulating trench around the perimeter of an active region of said transistor to isolate the active region from other structures on said substrate;
   b) etching an insulating undercut in the bottom of the insulating trench to isolate at least a portion of the bottom surface of the active region from the substrate; and
   c) doping portion of the active region to from each of a source region and a drain region on opposing side of a central channel region, wherein the insulating undercut isolates at least a portion of both the source region and the drain region from the semiconductor substrate, and wherein the undercut isolates at least a portion of the central channel region from the semiconductor substrate, the undercut extending under the central channel region in a direction from the source region to the drain region;
   wherein the etching the undercut and the doping from a conductive bridge between the central channel region and the substrate.

2. The method of claim 1 wherein the step of etching the undercut includes the steps of:
   a) forming a protective layer on the side walls and bottom of the trench;
   b) performing a vertical anisotropic etch of said layer to remove such layer to expose the semiconductor substrate at the bottom of the trench; and
   c) performing an isotropic etch of the semiconductor substrate to form said undercut.

3. The method of claim 2 wherein the protective layer is silicon dioxide.

4. The method of claim 2 wherein the isotropic etch is performed using a KOH wet etch.

5. The method of claim 2 wherein the step of forming the insulator includes filling at least a portion of said undercut and said trench using a chemical vapor deposition process using at least one of TEOS or SiH4.

6. The method of claim 1 wherein the conductive bridge has a smaller cross-sectional area than the central channel region.

7. The method of claim 6 wherein the conductive bridge is narrower than the central channel region in every corresponding direction.

8. The method of claim 1 wherein the etching the undercut and the doping form a conductive bridge between the central channel region and the substrate, the conductive bridge having a significantly smaller cross-sectional area than the active region.

9. The method of claim 1, further comprising, prior to the doping, forming a gate on the active region.

10. The method of claim 9 wherein the gate acts as a mask for the doping, thereby defining the central channel region and aligning the source region and the gate region with the gate.

11. The method of claim 1 wherein the etching the insulating trench includes forming a silicon nitride layer, selectively etching the silicon nitride layer, and using the silicon nitride layer as an etch mask for the etching of the insulating trench.

12. The method of claim 2 wherein the performing the isotropic etch of the semiconductor substrate includes forming the undercut with a depth of between 1,000 and 2,000 Angstroms.

13. The method of claim 12 wherein the performing the isotropic etch of the semiconductor substrate includes forming the undercut so as to extend under the active portion a distance of between 1,000 and 2,000 Angstroms.

14. A method of forming a field effect transistor on a semiconductor substrate, comprising the steps of:
   a) etching an insulating trench around the perimeter of an active region of said transistor to isolate the active region from other structures on said substrate;
   b) etching an insulating undercut in the bottom of the insulating trench to isolate at least a portion of the bottom surface of the active region from the substrate, including:
      i) forming a protective layer on the side walls and bottom of trench;
      ii) performing a vertical anisotropic etch of said layer to remove such layer to expose the semiconductor substrate at the bottom of the trench; and
      iii) performing an isotropic etch of the semiconductor substrate to form said undercut;
   c) forming a gate on the active region;
   d) doping portions of the active region to form each of a source region and a drain region on opposing sides of a central channel region, wherein the gate acts as a mask for the doping, thereby defining the central channel region and aligning the source region and the gate region with the gate, wherein the insulating undercut isolates at least a portion of both the source region and the drain region from the semiconductor substrate, and wherein the undercut isolates at least a portion of the central channel region from the semiconductor substrate, the undercut extending under the central channel region in a direction from the source region to the drain region;

wherein the etching the undercut and the doping form a conductive bridge between the central channel region and the substrate.

15. The method of claim 14 wherein the conductive bridge has a smaller cross-sectional area than the central channel region.

16. The method of claim 15 wherein the conductive bridge is narrower than the central channel region in every corresponding direction.

17. The method of claim 14 wherein the etching the undercut and the doping form a conductive bridge between the central channel region and the substrate, the conductive bridge having a significantly smaller cross-sectional area than the active region.

18. The method of claim 14 wherein the performing the isotropic etch of the semiconductor substrate includes forming the undercut with a depth of between 1,000 and 2,000 Angstroms.

19. The method of claim 18 wherein the performing the isotropic etch of the semiconductor substrate includes forming the undercut so as to extend under the active portion a distance of between 1,000 and 2,000 Angstroms.

20. A method of forming a field effect transistor, comprising:

a) etching an insulating trench in a semiconductor substrate to define an active region therein;

b) forming an insulating undercut in the bottom of the insulating trench to isolate a portion of the bottom surface of the active region from a remainder of the substrate, including:

i) forming a protective layer on the side walls and bottom of trench;

ii) performing a vertical anisotropic etch of said layer to remove such layer to expose the semiconductor substrate at the bottom of the trench; and iii) performing an isotropic etch of the semiconductor substrate to form the undercut;

c) forming a gate on the active region;

d) doping portions of the active region to form each of a source region and a drain region on opposing sides of a central channel region, wherein the gate acts as a mask for the doping, thereby defining the central channel region and aligning the source region and the gate region with the gate, wherein the insulating undercut isolates at least a portion of both the source region and the drain region from the semiconductor substrate, and wherein the undercut isolates at least a portion of the central channel region from the semiconductor substrate, the undercut extending under the central channel region in a direction from the source region to the drain region;

wherein the etching the undercut and the doping form a conductive bridge of semiconductor material between the central channel region and the remainder of the substrate, thereby leaving an electrical connector between the central channel region and the remainder of the substrate via the conductive bridge; and wherein the conductive bridge has a smaller cross-sectional area than the central channel region.

21. The method of claim 20 wherein the conductive bridge is narrower than the central channel region in every corresponding direction.

22. The method of claim 20 wherein the performing the isotropic etch of the semiconductor substrate includes forming the undercut with a depth of between 1,000 and 2,000 Angstroms.

23. The method of claim 22 wherein the performing the isotropic etch of the semiconductor substrate includes forming the undercut so as to extend under the active portion a distance of between 1,000 and 2,000 Angstroms.

\* \* \* \* \*